United States Patent [19]
Small et al.

[11] Patent Number: 5,462,622
[45] Date of Patent: Oct. 31, 1995

[54] MOLDING AN ELECTRICAL ELEMENT WITHIN A PREMOLD ELEMENT AND AN OVERMOLD ELEMENT TO PROVIDE A ONE-PIECE COMPONENT

[75] Inventors: Edith M. Small, New Lenox; Michael V. Prisby, Lockport; Terry D. Thomason, Kankakee, all of Ill.

[73] Assignee: Illinois Tool Works Inc., Glenview, Ill.

[21] Appl. No.: 257,589

[22] Filed: Jun. 9, 1994

[51] Int. Cl.⁶ .............................. B29B 11/08; B29C 45/16
[52] U.S. Cl. .............. 156/245; 264/272.11; 264/272.15; 264/275
[58] Field of Search .................... 264/272.11, 272.14, 264/272.15, 277, 274, 275; 361/730, 813, 824; 174/52.2; 156/245

[56] References Cited

U.S. PATENT DOCUMENTS

| | | | |
|---|---|---|---|
| 4,335,932 | 6/1982 | Herrmann, Jr. | 174/52.2 |
| 4,600,971 | 7/1986 | Rose et al. | 361/813 |
| 4,701,999 | 10/1987 | Palmer | 264/274 |
| 4,821,413 | 4/1989 | Schmitt et al. | 264/272.11 |
| 4,895,536 | 1/1990 | Gingerich et al. | 264/272.14 |
| 5,194,694 | 3/1993 | Hendel et al. | 264/272.11 |
| 5,279,030 | 1/1994 | Ito et al. | 264/272.11 |

FOREIGN PATENT DOCUMENTS 2110587  6/1983  United Kingdom.

*Primary Examiner*—Michael W. Ball
*Assistant Examiner*—Richard Crispino
*Attorney, Agent, or Firm*—Schwartz & Weinrieb

[57] ABSTRACT

A method of molding an electrical element within an associated plastic housing so as to provide a one-piece finished component where the electrical element, joints between the electrical element and the housing, and seams between a premold portion and an overmold portion of the plastic housing are designed and positioned for shielding from ambient atmosphere so that the electrical element is protected from contamination and degradation from the elements.

9 Claims, 3 Drawing Sheets

MOLDING AN ELECTRICAL ELEMENT WITHIN A PREMOLD ELEMENT AND AN OVERMOLD ELEMENT TO PROVIDE A ONE-PIECE COMPONENT

FIELD OF THE INVENTION

The present invention relates generally to molding methods, and more particularly to a method of molding a sensitive member, such as an electrical element, within a one-piece plastic housing for ease of installation within a desired device where the electrical element is completely shielded from the ambient atmosphere so as to prevent contamination and degradation of the electrical element during use.

BACKGROUND OF THE INVENTION

Molding of plastic materials has become increasingly more complex in connection with the provision of finished components for use in a wide variety of applications. Two advanced methods of molding include insert molding and premolding/overmolding processes.

Insert molding typically includes providing some type of insert, usually formed from a non-plastic material such as metal or the like, within a mold of a molding machine. Thereafter, plastic material is injected about the insert or desired portions thereof so as to complete the component.

In a premolding/overmolding process, a premold element is typically provided with a predetermined configuration in a first mold of a molding machine. After removal of the premold element from the first mold, the premold element is inserted within a second mold of a molding machine so as to "overmold" more plastic about the premold element or selected areas thereof.

During injection molding, obtaining a hermetic seal between components is not possible. Depending on the environment and the desired finished component, a hermetically sealed component can be a desirable feature.

This is particularly true when a sensitive insert, such as an electrical element, is molded in an insert molding process. With such an electrical element, it is typically desirable to provide protection against degradation of the electrical component over time which can occur from the ambient atmosphere or from exposure to materials or fluids during use.

It therefore would be desirable to provide a method for molding a one-piece plastic electrical component having a sensitive electrical element formed therein where the electrical element is completely shielded from the ambient atmosphere so as to prevent contamination and degradation of the electrical element during use.

SUMMARY OF THE INVENTION

The invention comprises a method of molding an electrical element within an associated housing so as to provide a one-piece finished component which prevents exposure of the electrical element to the ambient atmosphere thereby eliminating contamination and degradation of the electrical element. The method includes insert molding the electrical element within a premold member and then overmolding selected portions of the premold member and electrical element with an overmold member.

After molding, unmolded areas are shielded from the ambient atmosphere so as to provide the finished one-piece component where the electrical element is hermetically sealed. Portions of the premold member and the electrical element are provided to hold those members during molding of the overmold member.

A plurality of components are preferably molded simultaneously with a portion of the electrical element of each component serving to hold adjacent components together. During or after molding, selected areas of the electrical element are trimmed so as to form the desired circuit of the component.

BRIEF DESCRIPTION OF THE DRAWINGS

Various other features and attendant advantages of the present invention will become more apparent from the following detailed description, when considered in connection with the accompanying drawings in which like reference characters designate like or corresponding parts throughout the several views, and wherein.

DESCRIPTION OF THE PREFERRED EMBODIMENT

Figure 1:
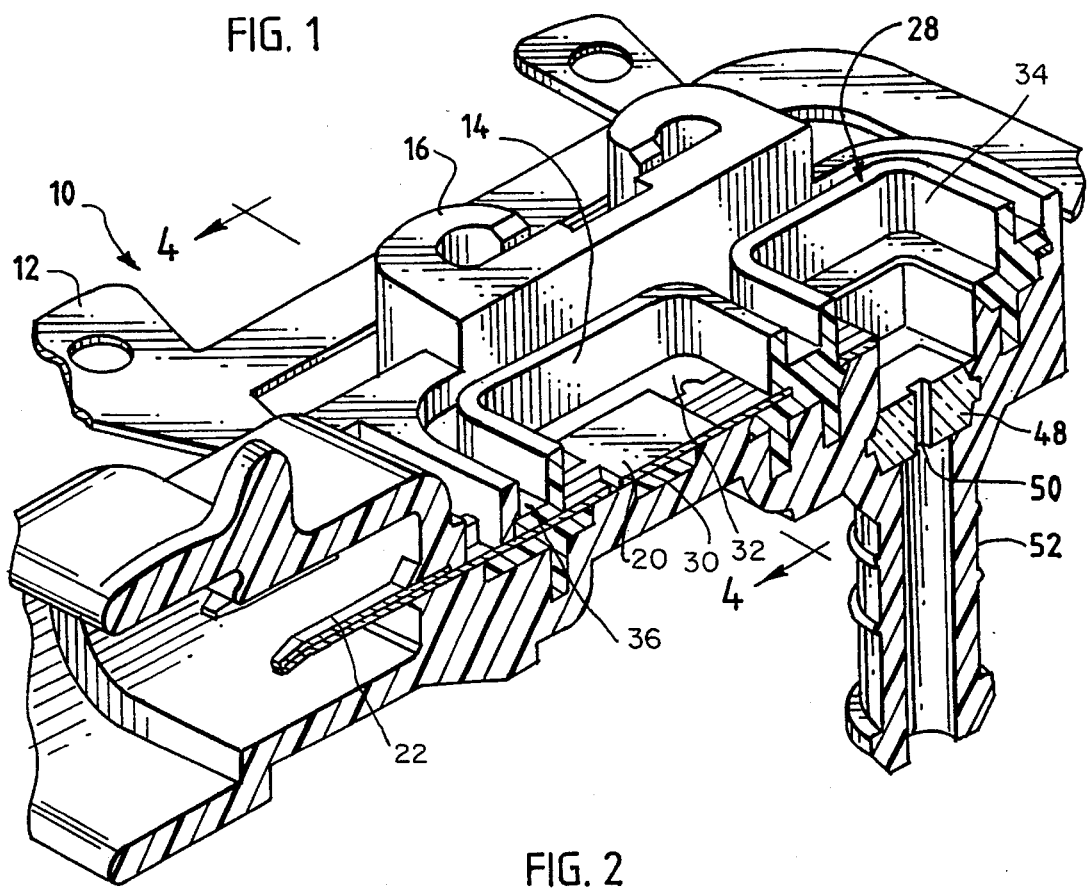
FIG. 1 is a perspective, longitudinal, cross-sectional view of a one-piece component of the invention illustrating the electrical element, the premold element and the overmold element thereof.

Referring to FIG. 1, a component provided by the method of the invention is designated generally by the reference numeral 10. The method provides a component 10 formed to provide a one-piece member and substantially includes an electrical element or leadframe 12, a first premold element 14 and a second overmold element 16.

In the present specification and drawings, the component 10 is depicted as a fuel line vapor sensor utilized in vehicle fuel systems. It is to be understood, however, that the method of the present invention can provide a component 10 for use in a variety of applications without departing from the teachings of the present invention.

Figure 3:
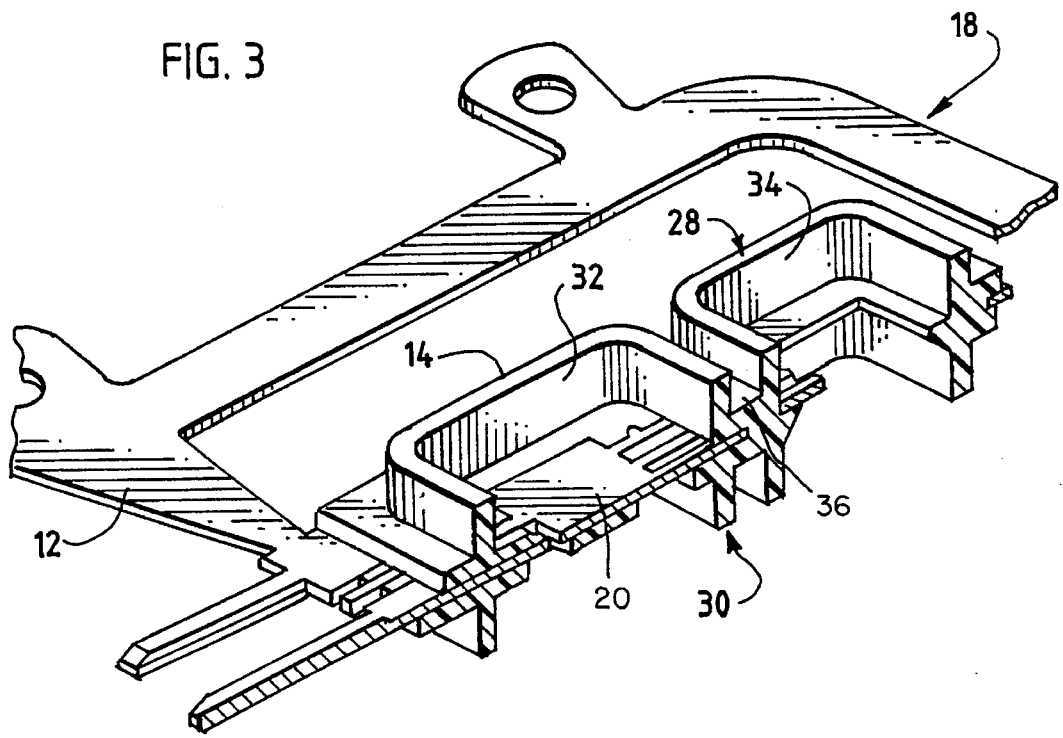
FIG. 3 is a perspective cross-sectional view of the electrical element premolded with the premold element.

To form the finished component 10, the electrical element 12 is positioned within a mold of a molding machine (not illustrated) and the first premold element 14 is molded thereabout. Upon removal from the molding machine, an intermediate insert molded element 18, illustrated in detail in FIG. 3, is provided including both the electrical element 12 and the first premold element 14.

Figure 4:
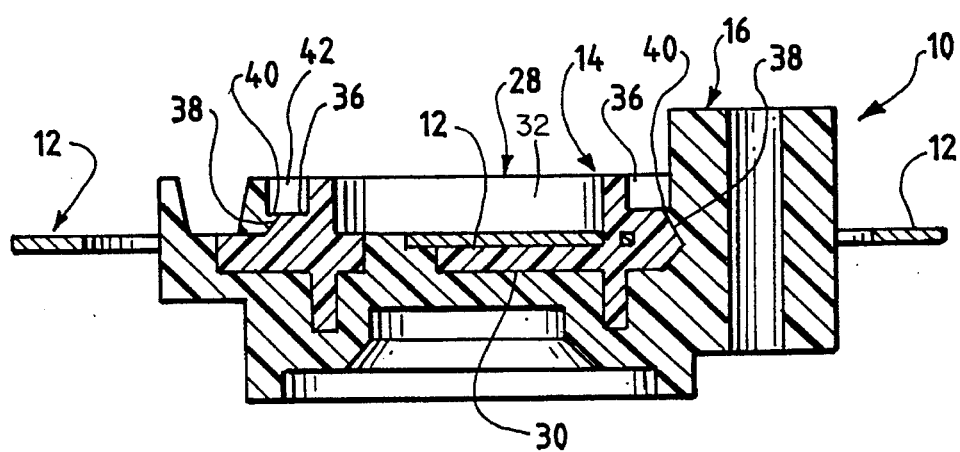
FIG. 4 is a cross-sectional view of the component taken along line 4—4 of FIG. 1 and in the direction indicated.
Figure 5:
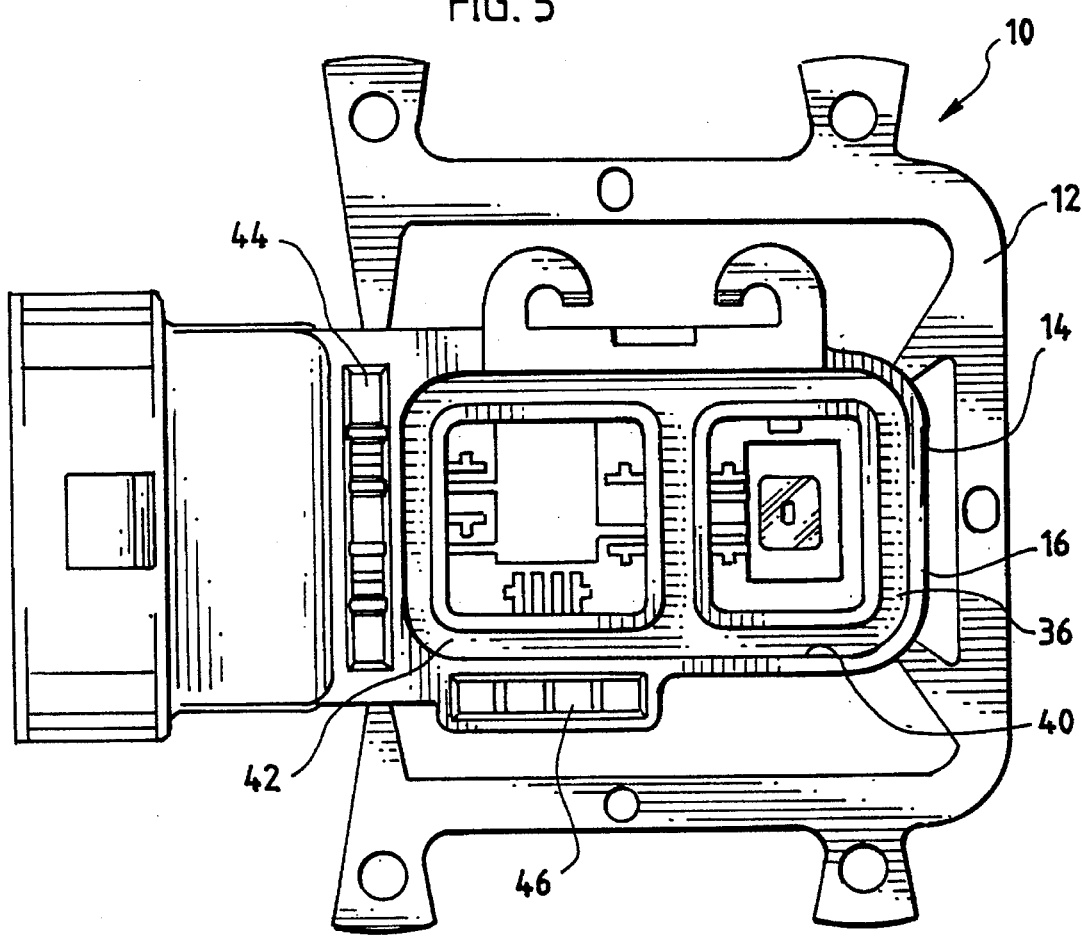
FIG. 5 is a top plan view of the component illustrated in FIG. 1.

The insert molded element 18 is then positioned in another mold of a molding machine (not illustrated) and the second overmold element 16 is molded about selected areas of both the electrical element 12 and the first premold element 14. Upon removal from the mold, the finished component 10 as illustrated in FIGS. 1, 4 and 5 is provided. Details of the component 10 and its molding will now be provided.

Figure 2:
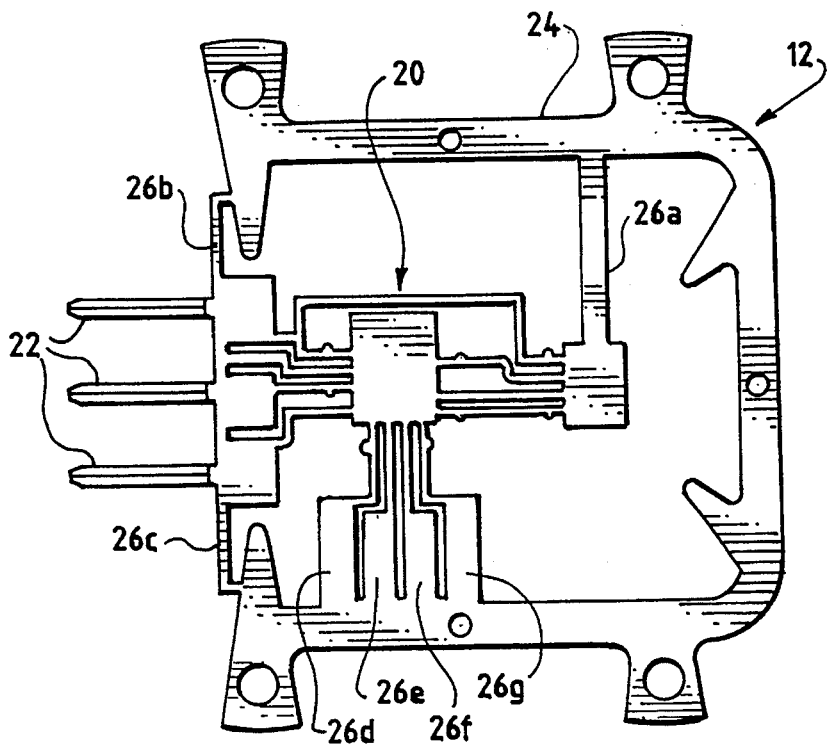
FIG. 2 is a top plan view of the electrical element of the invention.

As FIG. 2 illustrates, the electrical element 12 is preferably stamped from a desired conductive metal and includes, inter alia, a central portion 20, three electrical contacts 22 and an outer frame or "halo" member 24. The particular material and shape of the electrical element 12, however, can vary.

The central portion 20 typically creates the desired electronic circuit, but can vary. Preferably, an electronic fuel sensor element (not illustrated) is mounted upon the central portion 20 after molding.

As FIG. 1 illustrates, the electrical contacts 22 extend to the exterior of both the premold element 14 and the overmold element 16 for connection to a desired electrical lead or other component (not illustrated). The outer frame 24 primarily serves to hold the central portion 20 in position during premolding and overmolding and is preferably connected to the central portion 20 by seven connecting legs 26a–26g. Each leg 26a–26g is cut or trimmed during or after final molding of the overmold element 16.

As FIG. 3 illustrates, the premold element 14 is molded about predetermined portions of the central portion 20 of the electrical element 12. As described in detail below, the premold element 14 is designed in such a way that any seams between the premold element 14 and the overmold element 16 are provided in predetermined areas which can be shielded by subsequent processing.

The premold element 14 substantially includes a top surface 28, a bottom surface 30, and first and second pockets 32 and 34. The pockets 32 and 34 are utilized to hold the premold element 14 within cores or cavities (not illustrated) during overmolding of the overmold element 16 to prevent any floating in the x or y direction as plastic is injected within the overmold cavities. To prevent floating of the premold element 14 in the z direction, the outer frame 24 of the electrical element 12 is utilized to retain the premold element 14 within the cavities.

As FIGS. 1 and 4 illustrate, the bottom surface 30 of the premold element 14 is encapsulated by the overmold element 16. The top surface 28 and pockets 32 and 34, however, remain substantially exposed to the exterior of the finished component 10.

As FIGS. 4 and 5 illustrate, the premold element 14 includes a peripheral shoulder 36 formed thereabout. The shoulder 36 includes an outwardly tapered edge 38 having a top line 40 which forms the seam between the periphery of the premold element 14 and the overmold element 16.

Accordingly, the interface between the top surface 28 of the premold element 14 and the overmold element 16 is provided along the tapered edge 38 with exposure of the seam formed therebetween to ambient atmosphere confined along the top line 40. Thus, in order to form a hermetic seal between the premold element 14 and the overmold element 16, only the top line 40 must be sealed or shielded.

Preferably, a cover member (not illustrated) is provided having a depending lip for engagement within a channel or glue track 42 formed about the premold element 14 between the premold element 14 and the overmold element 16. The cover member is secured along the top line 40 with an adhesive or the like.

The cover member thus seals the central portion 20 of the electrical element 12 and the pockets 32 and 34 of the premold element 14 from ambient atmosphere. As FIG. 5 illustrates, after removal of the outer frame 24, the only portions of the electrical element 12 exposed to atmosphere are portions 44 and 46. After molding of the component 10, however, the portions 44 and 46 are filled with a potting compound or the like thereby sealing them from exposure to ambient atmosphere.

As FIG. 1 illustrates, if desired, a button 48, preferably made of glass and having an aperture 50 therethrough, can be positioned within the pocket 34 for mounting of the fuel sensor (not illustrated) thereon. The aperture 50 communicates with a hollow stem 52 formed with the overmold member 16 for communicating fuel vapors to the sensor.

Figure 6:
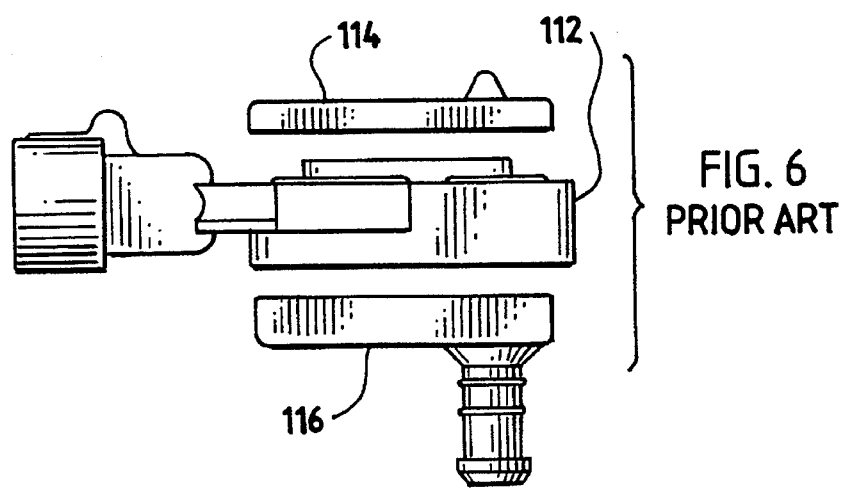
FIG. 6 is a side elevational exploded view of a prior art electrical component.

FIG. 6 illustrates a prior art component 110 which is comprised of a housing 112, a cover member 114 and a backplate 116. An electrical sensor or element (not illustrated) is attached to the backplate 116 for connection with the electrical element or leadframe and terminals (not illustrated) within the housing 112.

Accordingly, the prior art components 110 were assembled individually. The backplate 116, with its attached electrical sensor, was glued onto the housing 112 with the sensor being electrically connected to the terminals by wire bonding. The cover 114 was then glued onto the housing 112.

The method of molding the component 10 of the present invention overcomes the problems associated with the complex prior art component 110 by providing a sealed one-piece component 10 for easy assembly and complete protection of the electrical element 12. Thus, significant costs savings in materials and manufacturing are realized.

Modifications and variations of the present invention are possible in light of the above teachings. It is to be understood that within the scope of the claims the invention may be practiced other than specifically described.

We claim:

1. A method of molding an electrical element within an associated plastic housing so as to provide a one-piece finished component wherein said electrical element, joints between said electrical element and said housing, and a seam between different portions of said housing are shielded so as to protect said electrical element from ambient atmosphere, comprising the steps of:

providing an electrical element;

insert molding selected portions of said electrical element within a premold member having predetermined means for supporting said premold member and said electrical element within an overmold mold, at least one lead of said electrical element extending to the exterior of said premold member for connection to a desired electrical circuit;

inserting said premold member and said electrical element within said overmold mold such that said means of said premold member for supporting said premold member and said electrical element support said premold member and said electrical element within said overmold mold, and molding selected portions of said electrical element and said premold member within an overmold member such that said means of said premold member for supporting said premold member and said electrical element within said overmold mold are not encapsulated within said overmold member, said at least one lead of said electrical element extends to the exterior of said overmold member for connection to said electrical circuit, and at least one surface of said premold member is unmolded by said overmold member so as to create a seam therebetween along said at least one surface; and providing means for shielding said seam as well as any unmolded portions of said electrical element, except for said at least one lead of said electrical element, from ambient atmosphere so as to provide a one-piece finished component wherein said electrical element thereof, except for said at least one lead of said electrical element, is hermetically sealed from said ambient atmosphere so as to prevent contamination or degradation of said electrical element.

2. The method as defined in claim 1, wherein:

said step of providing said means for shielding includes the step of selecting said means for shielding from at least one of a protective cover, an adhesive, a potting compound, and a protective boot member.

3. The method as defined in claim 1, wherein:

said means for supporting said premold member and said electrical element within said overmold mold is molded upon said at least one surface of said premold member.

4. The method as defined in claim 1, further comprising the steps of:

providing said electrical element with a central portion and an outer frame portion connected to said central portion; and holding said premold member during molding of said overmold member by said outer frame portion of said electrical element.

5. The method as defined in claim 4, further comprising the steps of:

connecting a plurality of adjacent components together by said outer frame portions; and simultaneously molding said plurality of connected components.

6. The method as set forth in claim 4, further comprising the step of:

severing said outer frame portion from said central portion of said electrical element after molding of said overmold member.

7. The method as set forth in claim 1, wherein:

said means for supporting said premold member and said electrical element within said overmold mold comprise upstanding walled pockets.

8. The method as set forth in claim 1, wherein:

said one-piece finished component comprises a fuel line vapor sensor.

9. The method as set forth in claim 8, wherein:

said overmold member comprises a hollow stem portion for conducting fuel vapors to said vapor sensor.

* * * * *